United States Patent
Shringarpure et al.

(10) Patent No.: US 8,035,435 B1
(45) Date of Patent: Oct. 11, 2011

(54) DIVIDED CLOCK SYNCHRONIZATION

(75) Inventors: Rahul Shringarpure, Calabasas, CA (US); Cynthia D. Baringer, Malibu, CA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 12/567,596

(22) Filed: Sep. 25, 2009

(51) Int. Cl.
*H03L 7/00* (2006.01)

(52) U.S. Cl. ......... 327/167; 327/147; 327/153; 327/158

(58) Field of Classification Search ............... 327/141, 327/144–163, 115, 116, 117, 118, 355–361, 327/202, 203, 208–212, 218; 331/15–17; 375/373–376; 377/47, 48; 370/542–544
See application file for complete search history.

(56) References Cited

U.S. PATENT DOCUMENTS

| | | | | |
|---|---|---|---|---|
| 5,128,940 A | * | 7/1992 | Wakimoto | 370/544 |
| 5,483,540 A | * | 1/1996 | Okamura | 370/542 |
| 6,608,530 B1 | * | 8/2003 | Green et al. | 331/25 |
| 6,970,115 B1 | * | 11/2005 | Sardi et al. | 341/100 |
| 7,109,756 B1 | * | 9/2006 | Zhang | 326/93 |

OTHER PUBLICATIONS

Application Note 3901—Synchronizing Multiple High-Speed Multiplexed DACs for Transmit Applications, Maxim Integrated Products, Sep. 21, 2006.

* cited by examiner

*Primary Examiner* — Lincoln Donovan
*Assistant Examiner* — Brandon Cole
(74) *Attorney, Agent, or Firm* — Toler Law Group (57) ABSTRACT

Circuits, demultiplexers, and methods are disclosed. A circuit includes a reference clock input to receive clock pulses at a reference clock speed. An internal divided clock input receives a divided clock signal from a clock divider that is driven by the clock pulses. The clock divider generates the divided clock signal at a second clock speed that is a fraction of the reference clock speed. An external divided clock input receives an external divided clock signal. The external divided clock signal is driven by the clock pulses and operates at the second clock speed. A clock transition synchronization circuit suppresses application of one or more of the clock pulses to the clock divider when the divided clock signal transitions between clock states out of synchronization with the external divided clock signal.

20 Claims, 6 Drawing Sheets

DIVIDED CLOCK SYNCHRONIZATION

FIELD OF THE DISCLOSURE

The present disclosure is generally related to synchronizing a transition between clock states of a divided clock signal in each of plurality of electronic devices.

BACKGROUND

The continued development and proliferation of digital technology results in large quantities of digital data being generated, transmitted, collected, processed, and stored. For example, in processing a large quantity of information, such as a data stream from a satellite, conversion of raw data by a fast analog-to-digital converter may generate a large stream of digital data. In order to accommodate the large stream of digital data, the stream may be deserialized into multiple separate streams of data that can be stored or processed by available digital devices.

One way of deserializing a large digital data stream is to demultiplex the data stream with the demultiplexed outputs routed to separate digital devices or to separate inputs of a digital system. However, demultiplexing the digital data stream presents its own problems.

For example, if the analog-to-digital converter has an eight bit output and the output is to be divided into eight separate streams to accommodate the data, an 8-bit-to-64-bit (8:64) demultiplexer may be used. However, inexpensive 8:64 demultiplexers generally may not be commercially available. Further, an 8:64 demultiplexer is a relatively high density device and relatively few 8:64 demultiplexers may be manufactured on a single wafer which may lead to wafer yield concerns. By contrast, lower density demultiplexers, such as 1:8 or 2:16 demultiplexers may be commonly commercially available and may have higher wafer yields leading to reduced costs.

Although an 8:64 demultiplexer may be replaced by an array of individual demultiplexers, such as an array of four parallel 2:16 demultiplexers or an array of eight parallel 1:8 demultiplexers, a problem remains in synchronizing the individual demultiplexers. The individual demultiplexers may each include a data tree and a clock divider that accepts a reference clock input and clocks a demultiplexed data output at a reduced clock rate. However, as is the case with many digital devices, on being powered up, different demultiplexers may start up with different gates in different states. As a result, the individual demultiplexers may start up with their respective clock dividers in different states, resulting in the output of the different individual demultiplexers being out of synchronization and potentially causing misalignment of the deserialized data bits in the output.

Some demultiplexers and other digital devices may be equipped with clock reset inputs. However, applying an accurately synchronized input to each of a plurality clock inputs may be difficult. Further, if a clock reset input fails to properly reset a clock divider or if the clock reset signal is not accurately and simultaneously applied to each of the devices, the devices may remain desynchronized as long as the devices remain powered on.

SUMMARY

Embodiments disclosed herein include circuits, demultiplexers, and methods for synchronizing divided clock signals. Embodiments may be used by two or demultiplexers or other devices that are arranged to receive an input data signal and an input clock signal that both operate at a first clock speed. The two or more devices are further arranged to generate an output data signal and an output clock signal that both operate at a second clock speed. The second clock speed may be a fraction of the first clock speed. Each of the devices may use a clock divider that receives clock pulses at the first clock speed and generates one or more divided clock signals to step down the speed of the clock pulses to the second clock speed. For example, the clock divider may generate a first divided clock signal that operates at one-half of the first clock speed, a second divided clock signal that operates at one-fourth of the first clock speed, etc., eventually generating a divided clock output signal that operates at the second clock speed.

To synchronize the output data signals, the divided clock output signals generated by the two devices are compared. When the divided clock output signals transition between clock states (e.g., from a low level to a high level or from a high level to a low level) out of synchronization with each other, the divided clock output signal of one of the devices, designated as a slave device, is synchronized to the divided clock output signal of a device regarded as a master device. Each time one of the divided clock output signals transitions out of synchronization with the other, one of the reference clock pulses supplied to the clock divider of the slave device is suppressed. Suppressing the reference clock pulse in the slave device delays toggling of the one or more divided clock signals produced by the clock divider of the slave device. The divided clock output signals continue to be compared until the divided clock output signals transition between clock states in synchronization.

In a particular illustrative embodiment, a circuit includes a reference clock input to receive clock pulses at a reference clock speed. An internal divided clock input receives a divided clock signal from a clock divider. The clock divider is driven by the clock pulses. The clock divider generates the divided clock signal at a second clock speed that is a fraction of the reference clock speed. An external divided clock input receives an external divided clock signal. The external divided clock signal is driven by the clock pulses and operates at the second clock speed. A clock transition synchronization circuit suppresses application of one or more of the clock pulses to the clock divider when the divided clock signal transitions between clock states out of synchronization with the external divided clock signal.

In another particular illustrative embodiment, a demultiplexer includes a first number of data inputs to receive data at a first clock speed and a second number of data outputs to output data at a second clock speed, where the second number is at least double the first number. A data tree routes a data bit received at any of the data inputs to one of the data outputs. A clock divider is configured to receive reference clock pulses at the first clock speed and to generate a divided clock signal at the second clock speed. The clock divider is clocked by the reference clock pulses. A clock transition synchronization circuit is configured to receive an external divided clock signal at the second clock speed. The clock transition synchronization circuit determines when the divided clock signal transitions out of synchronization with the external divided clock signal. When the divided clock signal transitions between clock states out of synchronization with the external divided clock signal, the clock transition synchronization circuit suppresses one or more reference clock pulses from being applied to the clock divider until the divided clock signal transitions in synchronization with the external divided clock signal.

In still another particular illustrative embodiment, a method includes receiving a plurality of clock pulses. A first plurality of divided clock signals is generated from the plurality of clock pulses to clock data signals of a first demultiplexer. Each successive divided clock signal of the first plurality of divided clock signals is generated at one-half of a preceding clock speed. The first plurality of divided clock signals includes a first divided clock output signal that is a lowest speed divided clock signal and that has a first clock speed that is one-half of a data output switching speed of the first demultiplexer. A second divided clock output signal is recognized as a signal to which the first plurality of divided clock signals is to be synchronized. The second divided clock signal has a second clock speed that is substantially equal to the first clock speed of the first divided clock output signal. The second divided clock signal is received. In response to determining that the first divided clock output signal transitions between clock states out of synchronization with the second divided clock output signal, at least one clock pulse of the plurality of clock pulses is suppressed to delay generation of the first plurality of divided clock signals.

The features, functions, and advantages that have been described can be achieved independently in various embodiments or may be combined in yet other embodiments, further details of which are disclosed with reference to the following description and drawings.

DETAILED DESCRIPTION

When a plurality of devices, such as demultiplexers or other digital devices, are arranged in parallel to deserialize a digital data stream, data output by the parallel devices may be synchronized so that the deserialized data is not misaligned. When demultiplexers or other digital devices are powered on, the devices may start up in different states. Embodiments of the present disclosure synchronize divided clock signals by monitoring when a divided clock signal output by a slave device transitions between clock states out of synchronization with a master divided clock signal output of a master device. When the divided clock signal transitions between clock states out of synchronization, at least one of the reference clock pulses that drive the divided clock signal in the slave device is suppressed until the divided clock signal transitions in synchronization with the master divided clock signal.

Figure 1:
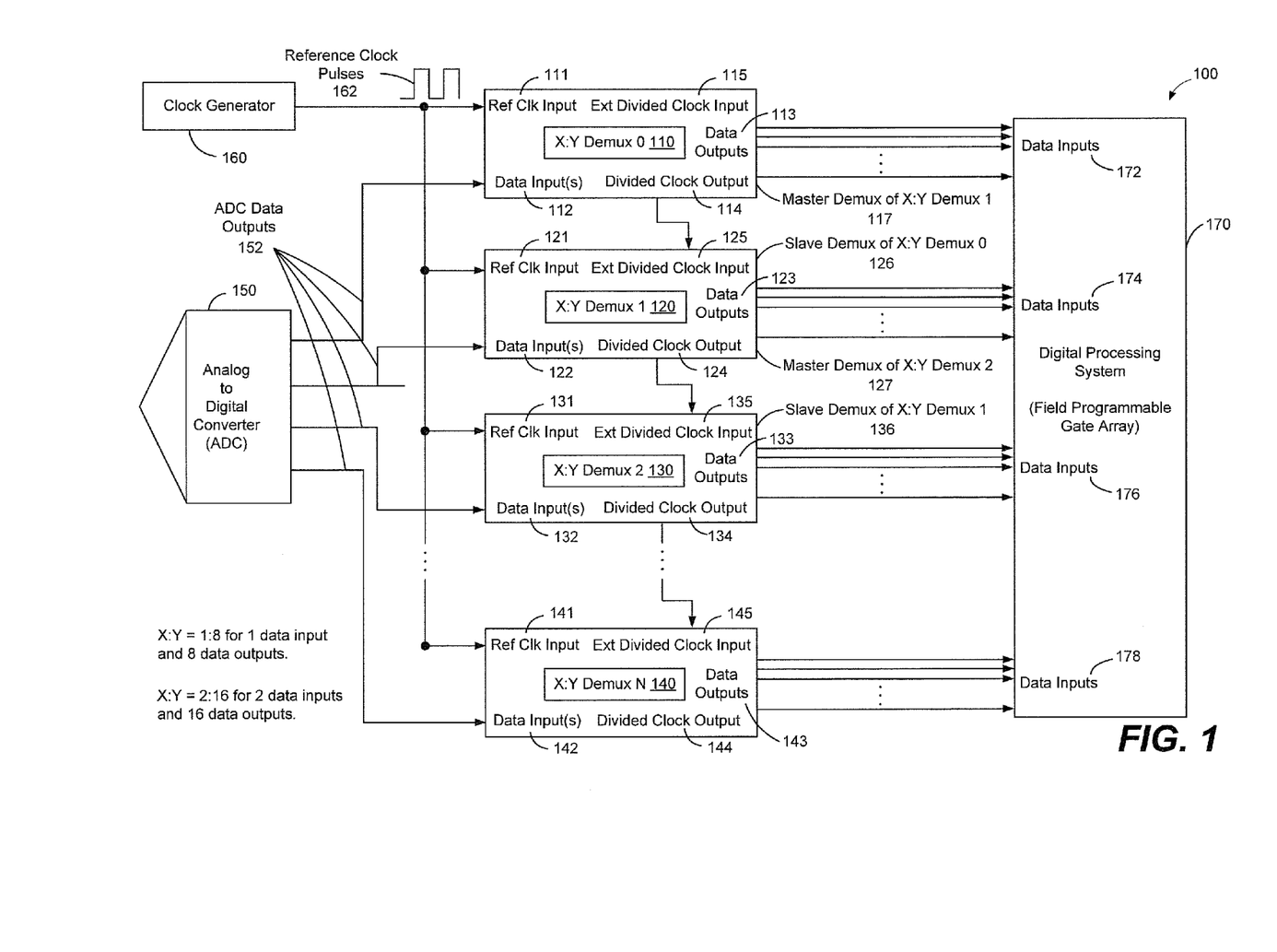
FIG. 1 is a schematic diagram of a circuit including a demultiplexer that utilizes a particular illustrative embodiment of divided clock synchronization.

FIG. 1 is a schematic diagram of a circuit 100 including a demultiplexer that utilizes a particular illustrative embodiment of divided clock synchronization. The circuit 100 includes synchronized demultiplexers 110, 120, 130, 140 arranged in parallel to deserialize an input data stream and distribute the deserialized data to a digital processing system 170. Each of the demultiplexers 110, 120, 130, 140 is designated as an X:Y demultiplexer, where X represents the number of data inputs and Y represents the number of data outputs over which the data inputs are distributed. The number of data outputs, represented by the second number Y is at least double the number of data inputs, represented by the first number X. Thus, for example, a 1:8 multiplexer receives a one-bit digital data stream and distributes or deserializes that one-bit digital data stream over eight data outputs using a data tree, as further described with reference to FIG. 2. For an additional example, a 2:16 demultiplexer receives a two-bit digital data stream and distributes or deserializes that two-bit digital data stream over sixteen data outputs. In other words, the X:Y designation indicates that each of the demultiplexers 110, 120, 130, 140 receives X data bits at its data input 112, 122, 132, 142 and generates Y data bits at its data outputs 113, 123, 133, 143.

Figure 2:
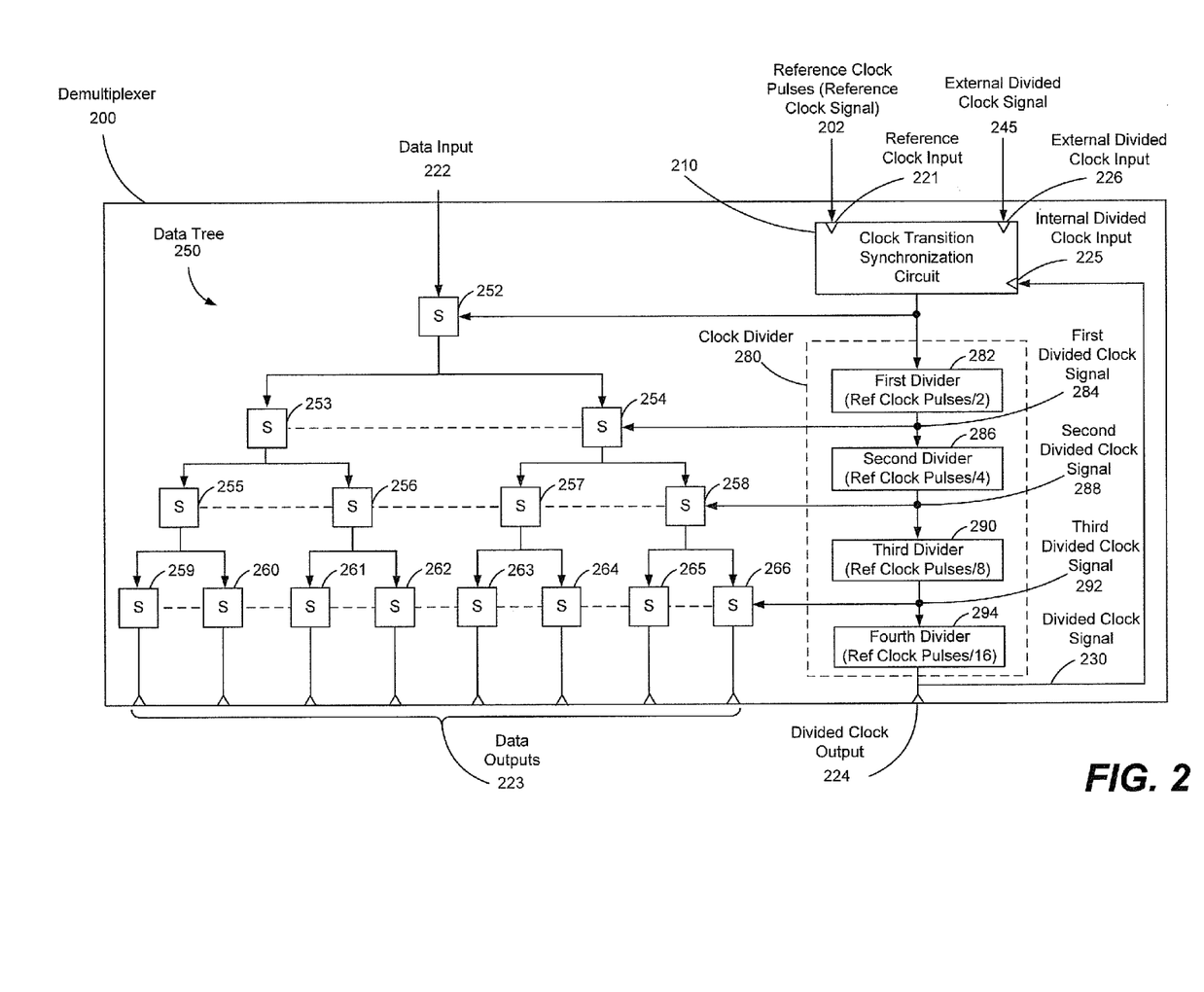
FIG. 2 is a schematic diagram of a particular illustrative embodiment of a demultiplexer that utilizes divided clock synchronization.

In a particular illustrative embodiment, each of the demultiplexers 110, 120, 130, 140 also includes a clock divider (such as the clock divider 280, as shown in FIG. 2) that receives a reference clock signal, such as reference clock pulses 162 from a clock generator 160 at a first clock speed. The first clock speed is substantially equal to a speed at which the input data stream is received. The clock divider generates a divided clock signal at a second clock speed that is a fraction of the frequency of the reference clock signal that clocks the data output of the demultiplexer 110, 120, 130, 140. In a particular illustrative embodiment, the fraction of the frequency is equal to one-half of the number of data inputs 112, 122, 132, 142 of the demultiplexer 110, 120, 130, 140 divided by the number of data outputs 113, 123, 133, 143. Thus, for example, a 1:8 demultiplexer generates a divided clock signal at one-sixteenth the speed of the speed of the first clock speed of the reference clock signal.

An analog to digital converter (ADC) 150 may be used as a source of the digital data stream received by the demultiplexers 110, 120, 130, 140. The ADC 150 receives an analog data stream (not shown in FIG. 1) such as a telemetry stream from a satellite or another remote device and converts the analog data stream into the digital data stream. The digital data stream is presented at ADC outputs 152. The digital data stream may be deserialized by the demultiplexers 110, 120, 130, 140 and supplied to a digital processing system 170, such as a field programmable gate array.

The plurality of demultiplexers 110, 120, 130, 140 may be used to deserialize the data stream produced at each of the ADC outputs 152 because the digital processing system 170 may not operate at a high enough clock speed to store or process the digital data stream at a speed at which the digital data stream is presented. FIG. 1 shows four exemplary ADC outputs 152 but there may be several times as many ADC outputs 152 depending on the nature of the analog data stream and the precision of the ADC 150. The clock speed at which the ADC outputs 152 generate data may be too fast to be received by the digital processing system 170. Thus, the four ADC outputs 152 may be demultiplexed by the plurality of demultiplexers 110, 120, 130, 140 into multiple, separate digital data streams clocked at a lower speed that are received at the data inputs 172, 174, 176, 178 of the digital processing system 170. The demultiplexers 110, 120, 130, 140 receive reference clock pulses 162 from the clock generator 160 or from another reference clock operating at a frequency at which the ADC 150 produces data via the ADC outputs 152.

The data input (or data inputs, if the demultiplexers 110, 120, 130, 140 receive more than a one-bit data stream) 112, 122, 132, 142 of the demultiplexers 110, 120, 130, 140 receive a number of input bits and the data outputs 113, 123, 133, 143 provide a number of data output bits as described by the X:Y designation of the demultiplexer. Each of the demultiplexers also receives the reference clock pulses 162 via a reference clock input 111, 121, 131, 141. According to a particular illustrative embodiment, each of the demultiplexers 110, 120, 130, 140 includes a divided clock output 114, 124, 134, 144 that presents a divided clock signal. The divided clock signal presented by the divided clock output 114, 124, 134, 144 may be a lowest speed divided clock output of a plurality of divided clock signals produced by a clock divider (as described with reference to FIG. 2) in each of the demultiplexers 110, 120, 130, 140.

As further described with reference to FIG. 2, the clock divider 280 may generate the lowest speed divided clock output that is provided as the divided clock output 114, 124, 134, 144 (FIG. 1) by generating a plurality of divided clock signals. Each of the plurality of divided clock signals may step down a speed of a received clock signal by generating an output clock signal at one-half of the speed of the received clock signal. For example, a first divided clock signal 284 may be generated at one-half of an original input clock signal, such as the reference clock pulses 202. A second divided clock signal 288 may be generated at one-half of the speed of the first divided clock signal 284, or at one-fourth of the speed of the original reference clock pulses 202. A third divided clock signal 292 may be generated at one-half the speed of the second divided clock signal 288, or at one-eighth the speed of the original reference clock pulses 202. A divided clock signal 230 may be generated at one-half the speed of the third divided clock signal 292, or at one-sixteenth the speed of the original reference clock pulses 202. Thus, the lowest speed divided clock signal presented as the divided clock signal 230, having divided the speed of the reference clock pulses 202 in half four times, may operate at a speed that is one-sixteenth of the speed of the reference clock pulses 202.

According to a particular illustrative embodiment, each of the demultiplexers 110, 120, 130, 140 includes an external divided clock input 115, 125, 135, 145. In the example of FIG. 1, the external divided clock input 125, 135, 145 of the demultiplexers 120, 130, 140 receives a divided clock signal from a divided clock output 114, 124, 134 from another demultiplexer 110, 120, 130, respectively. In the case of the X:Y demultiplexer 1 120, the external divided clock input 125 receives a divided clock signal from the divided clock output 114 of the X:Y demultiplexer 0 110. The divided clock signal of the X:Y demultiplexer 1 120 is synchronized to the clock signal produced at the divided clock output 114 of the X:Y demultiplexer 0 110. Thus, the X:Y demultiplexer 0 110 may serve as a master demultiplexer 117 of the X:Y demultiplexer 1 120 that operates as a slave demultiplexer 126 to the X:Y demultiplexer 0 110. Similarly, the external divided clock input 135 of the X:Y demultiplexer 2 130 receives a divided clock signal from the divided clock output 124 of the X:Y demultiplexer 1 120. Thus, the X:Y demultiplexer 1 120 may serve as a master demultiplexer 127 of the X:Y demultiplexer 2 130 that, in turn, operates as a slave demultiplexer 136 of the X:Y demultiplexer 1120. In similar fashion, the external divided clock input 145 of X:Y demultiplexer N 140 receives a divided clock signal from a preceding demultiplexer that acts as a master demultiplexer to the X:Y demultiplexer N 140 and, in turn, the X:Y demultiplexer N 140 operates as a slave demultiplexer to the preceding demultiplexer. In the example of FIG. 1, each of the X:Y demultiplexer 1 120, the X:Y demultiplexer 2 130, and the X:Y demultiplexer N 140 are slaved to another demultiplexer, while the X:Y demultiplexer 0 110 is not slaved to another demultiplexer. Thus, the X:Y demultiplexer 0 110 may be regarded as an overall master demultiplexer for the circuit 100 while the other demultiplexers 120, 130, 140 may be regarded as slave demultiplexers.

FIG. 2 is a schematic diagram of a particular illustrative embodiment of a demultiplexer 200 that utilizes divided clock synchronization. The demultiplexer 200 includes a clock transition synchronization circuit 210. In a particular illustrative embodiment, the demultiplexer 200 is a slave demultiplexer such as the X:Y demultiplexer 1 120, the X:Y demultiplexer 2 130, or the X:Y demultiplexer N 140 of FIG. 1. In a particular illustrative embodiment, the demultiplexers 110, 120, 130, 140 of FIG. 1 are identical and the only differences between the master demultiplexer 110 and the slave demultiplexers 120, 130, 140 may be how the demultiplexers 110, 120, 130, 140 are used. For purposes of illustration, the demultiplexer 200 is a 1:8 demultiplexer. However, according to other particular embodiments, the demultiplexer 200 could be a 1:4 demultiplexer, a 2:16 demultiplexer, or a demultiplexer having a different ratio of data inputs to number of data outputs.

In a particular illustrative embodiment, the demultiplexer 200 includes a data tree 250 that distributes or deserializes signals received via the data input 222. The data tree 250 includes a plurality of switches 252-266 that may be used to route a data bit received at the data input 222 to one of the data outputs 223. The data tree 250 may be driven by a clock divider 280 that controls the routing of data through the data tree 250 in response to a series of reference clock pulses or a reference clock signal 202 received from a clock generator, such as the clock generator 160 of FIG. 1. The data tree 250 presents data at data outputs 223 at a frequency of a third divided clock signal 292. As further described below, a divided clock signal 230, operating at one-half the speed of the third divided clock signal 292 is presented at a divided clock output 224.

To deserialize data received at the data input 222, the clock divider 280 may successively divide the reference clock pulses 202 to produce a series of divided clock signals at successively stepped-down frequencies. A first divider 282 may receive the reference clock pulses 202 (via the clock transition synchronization circuit 210) and generate a first divided clock signal 284 at one-half the frequency of the reference clock pulses 202. A second divider 286 may receive the first divided clock signal 284 and generate a second divided clock signal 288 at one-half the frequency of the first divided clock signal 284 or at one-fourth the frequency of the reference clock pulses 202. A third divider 290 may receive the second divided clock signal 288 and generate the divided clock signal 230 at one-half the frequency of the second divided clock signal 288 or at one-eighth the frequency of the reference clock pulses 202. A fourth divider 294 may receive the third divided clock signal 292 and generate the divided clock signal 230 at one-half the frequency of the third divided clock signal 292 or at one-sixteenth the frequency of the reference clock pulses 202. In the particular illustrative embodiment of FIG. 2, there are only four dividers 282, 286, 290, 294; thus, the divided clock signal 230 is the lowest speed divided clock signal.

In a particular illustrative embodiment, the clock transition synchronization circuit 210 selectively suppresses the reference clock pulses 202. In a particular illustrative embodiment, one of the reference clock pulses 202, received via a reference clock input 221, is suppressed each time the divided clock signal 230 and an external divided clock signal 245 transition out of synchronization from one another. Suppressing one of the reference clock pulses 202 may cause the first divider 282 to delay the first divided clock signal 284 by a duration one reference clock pulse. In a particular illustrative embodiment, the external divided clock signal 245 is received from another demultiplexer, such as the master demultiplexer 110 of FIG. 1 or another demultiplexer in an array of demultiplexers to which the demultiplexer 200 is to be synchronized.

Suppressing one of the reference clock pulses 202 delays the outputs of each of the dividers 282, 286, 290, 294. The second divided clock signal 288 is generated by the second divider 286 based on the first divided clock signal 284. Thus, delaying the first divided clock signal 284 by the duration of one reference clock pulse 202 delays generation of the second divided clock signal 288 by the duration of the reference clock pulse. Delaying the second divided clock signal 288 in turn delays the third divider 290 in generating the third divided clock signal 292. Delaying the third divided clock signal 292 in turn delays the fourth divider 294 in generating the divided clock signal 230. The divided clock signal 230 is output at the divided clock output 224 where, for example, the divided clock signal 230 may be supplied to a second demultiplexer, such as slave demultiplexer 130 or 140 of FIG. 1. The second demultiplexer may then synchronize to the divided clock signal 230 generated at the divided clock output 224 of the first slave demultiplexer 220.

The clock transition synchronization circuit 210 receives the divided clock signal 230 at an internal divided clock input 225. The clock transition synchronization circuit 210 also receives the external divided clock signal 245 at the external divided clock input 226 and compares the divided clock signal 230 with the external divided clock signal 245. When the divided clock signal 230 transitions between clock states (e.g., from a low level to a high level or from a high level to a low level, out of synchronization) with the external divided clock signal 245, the clock transition synchronization circuit 210 suppresses one of the reference clock pulses 202 from being supplied to the clock divider 280. The clock transition synchronization circuit 210 continues to compare the divided clock signal 230 with the external divided clock signal 245 and continues to suppress one or more of the reference clock pulses 202 as long as the divided clock signal 230 transitions between clock states out of synchronization with the external divided clock signal 245. When the divided clock signal 230 transitions in synchronization with the external divided clock signal 245 and, thus, has become synchronized with the external divided clock signal 245, the clock transition synchronization circuit 210 ceases to suppress reference clock pulses 202.

Note that, according to a particular illustrative embodiment, the divided clock signal 230 and the external divided clock signal 245 may be determined to be in synchronization when the divided clock signal and the external divided clock signal transition between clock states at the same time or upon the same clock pulse of the reference clock pulses 202. The divided clock signal 230 and the external divided clock signal 245 thus may be in synchronization regardless of whether the divided clock signal 230 and the external divided clock signal 245 transition to a same clock state (e.g., both transition to a low level or a high level) or when the divided clock signal and the external divided clock signal transition to opposite states (e.g., the divided clock signal transitions to a low level while the external divided clock signal transitions to a high level, or vice versa).

Figure 3:
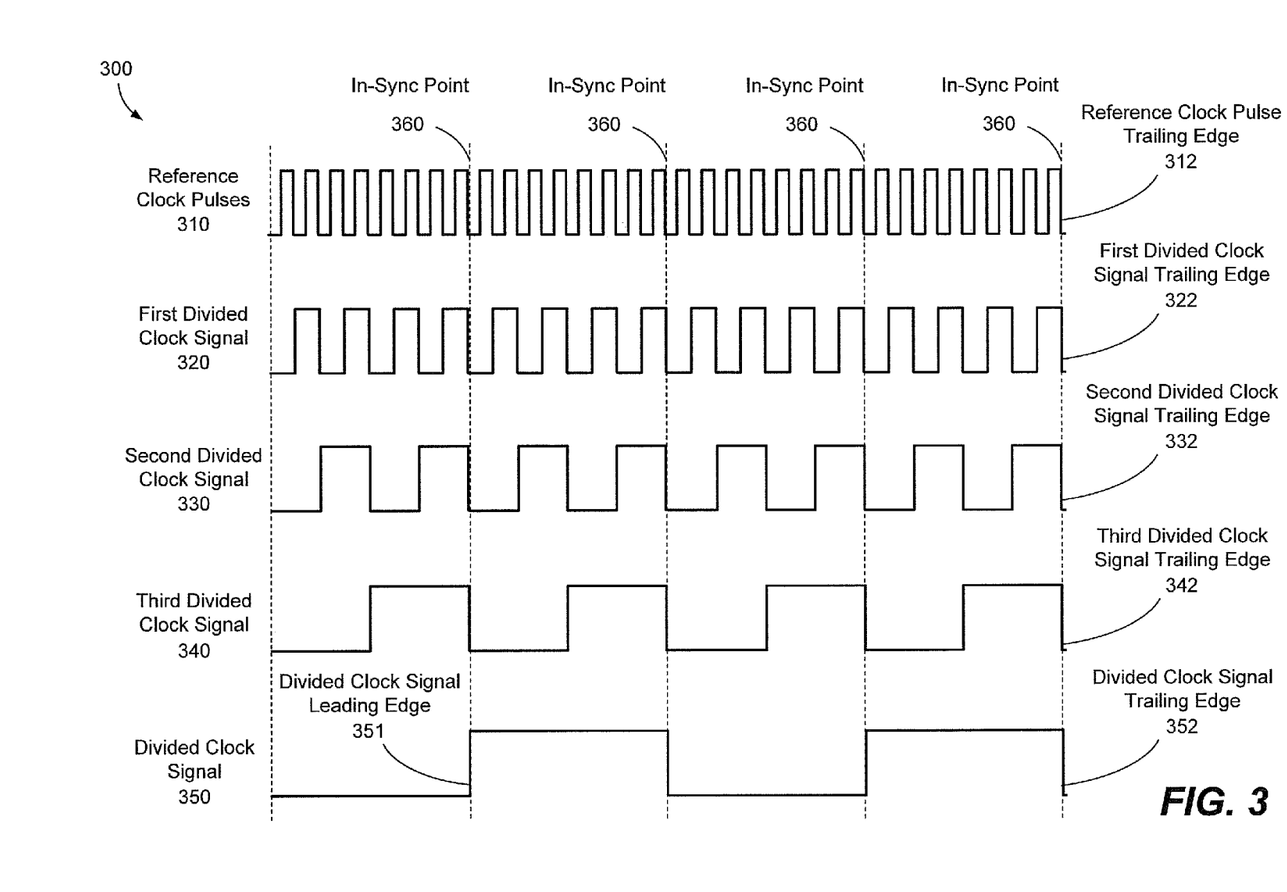
FIG. 3 is a timing diagram of reference clock pulses and a plurality of divided clock signals synchronizable according to a particular illustrative embodiment.

In a particular illustrative embodiment, each of the divided clock signals 284, 288, 292 has a leading edge or each of the divided clock signals 284, 288, 292 has a falling edge upon the transition between clock states of the divided clock signal 230, as shown in FIG. 3. Thus, by monitoring the clock state transitions of the lowest speed (or most divided) clock signals represented by the divided clock signal 230 and the external divided clock signal 245, all of the divided clock signals 284, 288, 292 may be synchronized between different demultiplexers or other devices.

FIG. 3 is a timing diagram 300 of reference clock pulses 310 and a plurality of divided clock signals 320, 330, 340, 350 synchronizable according to a particular illustrative embodiment. The timing diagram 300 shows how, in response to the reference clock pulses 310, a clock divider (such as the clock divider 280 of FIG. 2) generates a first divided clock signal 320, a second divided clock signal 330, a third divided clock signal 340, and a divided clock signal 350. Note that both divided clock signal leading edges 351 and divided clock signal trailing edges 352 correspond with a reference clock pulse training edge 312, a first divided clock signal trailing edge 322, a second divided clock signal trailing edge 332, and a third divided clock signal trailing edge 342. As shown in the timing diagram 300, at each in-synchronization point 360, when the reference clock pulse 310 and the plurality of divided clock signals 320, 330, 340 transition in synchronization, the divided clock signal 230 is at its leading edge 351 or at its trailing edge 352.

Embodiments of the present disclosure make use of the observation that the reference clock pulses 310 and the plurality of divided clock signals 320, 330, 340 transition in synchronization at the divided clock signal leading edge 351 or at the divided clock signal trailing edge 352. Thus, if the divided clock signal 350 is synchronized so that it transitions between clock states in synchronization with an external divided clock signal (not shown in FIG. 3), then other divided clock signals in the device generating the divided clock signal 350 and the device generating the external divided clock signal will be synchronized.

Figure 4:
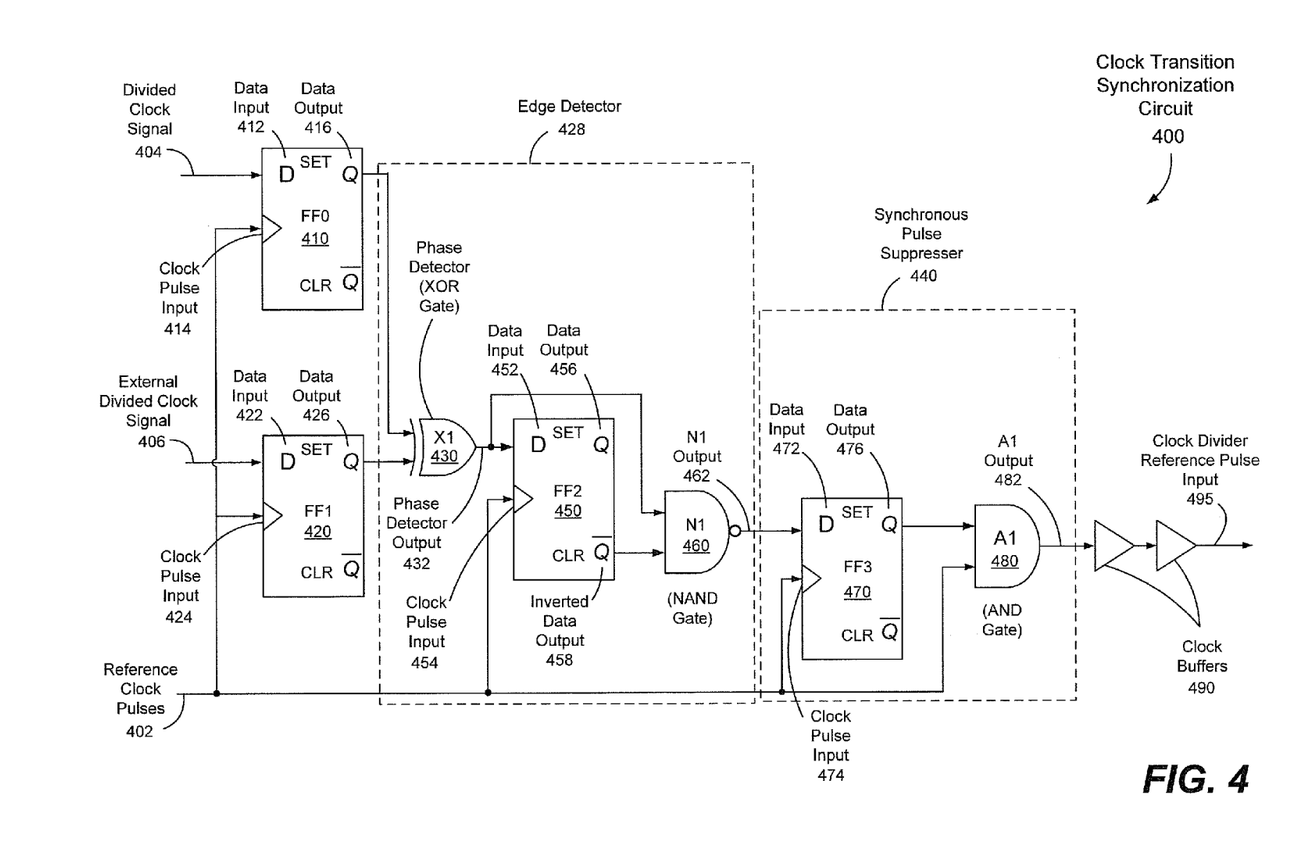
FIG. 4 is a schematic diagram of a particular illustrative embodiment of a clock transition synchronization circuit.

FIG. 4 is a schematic diagram of a particular illustrative embodiment of a clock transition synchronization circuit 400. For example, the clock transition synchronization circuit 400 may be the clock transition synchronization circuit 210 as described with reference to FIG. 2. The clock transition synchronization circuit 400 includes a plurality of flip-flops 410, 420, 450, 470, a plurality of logic gates 430, 460, 480, and one or more clock buffers 490. The clock transition synchronization circuit 400 may receive reference clock pulses 402, a divided clock signal 404, and an external divided clock signal 406. An output of the clock transition synchronization circuit 400 is presented to a clock divider reference pulse input 495. The clock divider reference pulse input 495 may be the input of a clock divider, such as the clock divider 280 of FIG. 2, that produces the divided clock signal 404. Applying the clock divider reference pulse input 495 to the clock divider enables the clock divider to synchronize the divided clock signal 404 with the external divided clock signal 406.

The flip-flop FF0 410 receives the divided clock signal 404 which may be an internal divided clock signal used to clock a device in which the clock transition synchronization circuit 400 is incorporated, such as the demultiplexer 200 of FIG. 2. The divided clock signal 404 is received at a data input 412 of the flip-flop FF0 410. The flip-flop FF0 410 is configured to receive the reference clock pulses 402 at a clock pulse input 414 to latch a value of the divided clock signal 404. The latched value of the divided clock signal 404 is presented at a data output 416 of the flip-flop FF0 410.

The flip-flop FF1 420 is configured to receive the external divided clock signal 406. The external divided clock signal 406 is received at a data input 422 of the flip-flop FF1 420. The flip-flop FF0 420 receives the reference clock pulses 402 at a clock pulse input 424 to latch a value of the external divided clock signal 406. The latched value of the external divided clock signal 406 is presented at a data output 426 of the flip-flop FF1 420.

The latched value of the divided clock signal 404 presented at the data output 416 of the flip-flop FF0 410 and the latched value of the external divided clock signal 406 presented at the data output 426 of the flip-flop FF1 420 are presented to an edge detector 428. According to a particular illustrative embodiment, the edge detector 428 includes a phase detector 430 in the form of an exclusive-OR (XOR) gate, a flip-flop FF2 450, and a Not-AND (NAND) gate 460. The phase detector 430 generates a logical high output signal when inputs to the XOR gate have different logical values and generates a low logical level signal when inputs to the XOR gate have a same logical value.

When the latched values of the divided clock signal 404 and the external divided clock signal 406 are not changing, the clock states of the divided clock signal 404 and the external divided clock signal 406 may both be low, may both be high, or may be different. When the latched values of the divided clock signal 404 and the external divided clock signal 406 remain the same, the phase detector output 432 will be a low signal and the inverted data output 458 of the flip-flop FF2 450, which has a clock pulse input 454 that receives the reference clock pulses 402, will be a high signal. (The data output 456, the non-inverted data output of the flip-flop 450 is not used in the illustrative embodiment of FIG. 4.) The NAND gate 460, receiving the phase detector output 432 and the inverted data output 458, will generate a high signal at an N1 output 462. Similarly, when the latched values of the divided clock signal 404 and the external divided clock signal 406 are different, the phase detector output 432 will be a high signal but the inverted data output 458 of the flip-flop FF2 450 will be a low signal. Still, the N1 output 462 will be a high signal because not both of the inputs to the NAND gate N1 460 are high signals.

However, when one of the divided clock signal 404 and the external divided clock signal 406 transitions to a different clock state different and the other clock signal does not, the edge detector 428 will register the change. For example, the latched values of the external divided clock signal 406 may transition from a low level clock state to a high level clock state while the divided clock signal 404 may remain at a low level clock state. As a result, the phase detector output 432 will change from a low level to a high level. The inverted data output 458, however, will continue to generate a high level signal latched when the phase detector output 432 was low. Thus, two high level signals will be supplied to the NAND gate N1 462, causing the N1 output 462 to be a low level signal. Note, however, that upon the next reference clock pulse 402, the flip-flop FF2 450 will latch the value of the phase detector output 432 so that the phase detector output 432 and the inverted data output 458 will again be opposite and thus cause the N1 output 462 to return to a high level.

The N1 output 462, which is the output of the edge detector 428, is presented to a synchronous pulse suppressor 440. The synchronous pulse suppressor 440 may cause one of the reference clock pulses 402 to be suppressed and not presented to a clock divider, such as the clock divider 280 of FIG. 2, when the divided clock signal 404 and the external divided clock signal 406 transition between clock states out of synchronization. By not presenting one of the reference clock pulses 402 to the clock divider (such as the clock divider 280 of FIG. 2), the divided clock signal 404 is delayed by a duration equal to a width of one of the reference clock pulses 402. The divided clock signal 404 may be delayed by the duration of one or more additional reference clock pulses 402 until the divided clock signal 404 transitions between clock states in synchronization with the external divided clock signal 406.

The divided clock signal 404 and the external divided clock signal 406 should transition between clock states in synchronization (although the divided clock signal and the external divided clock signal may be at opposing clock states) to assure that data produced by the data outputs of the demultiplexers (such as the data outputs 113, 123, 133, 143 of the demultiplexers 110, 120, 130, 140 of FIG. 1) are fully aligned. To synchronize the divided clock signal 404 with the external divided clock signal 406, each time one of the divided clock signal 404 and the external divided clock signal 406 transitions between clock states out of synchronization with the other, one of the reference clock pulses 402 is suppressed.

Thus, continuing with the foregoing example, when the external divided clock signal 406 transitioned to a high level clock state and the divided clock signal 404 remained at a low level clock state, the edge detector 428 generated a low level N1 output 462. The low value is latched by a flip-flop FF3 470 such that a data output 476 will be a low value for the duration of the clock pulse received at the clock pulse input 474 from the reference clock pulses 402. Thus, at a next of the reference clock pulses received at an AND gate A1 480, the reference clock pulse 402 may be high while the data output 476 is low, thus the A1 output 482 will be low. In other words, while the data output 476 is low, the reference clock pulse 402 received at the AND gate A1 480 will be suppressed.

When the phase detector 430 detects that the divided clock signal 404 and the external divided clock signal 406 are transitioning between clock states out of synchronization, the synchronous pulse suppressor 440 causes one of the reference clock pulses 402 to be suppressed. The clock transition synchronization circuit 400 then continues to compare the divided clock signal 404 and the external divided clock signal 406 to determine whether they are transitioning between clock states in synchronization or out of synchronization. When the divided clock signal 404 and the external divided clock signal 406 are determined to transition between clock states out of synchronization with one another, another of the reference clock pulses 402 will be suppressed. Suppressing one of the reference clock pulses 402 may prevent a clock divider, such as the clock divider 280 of FIG. 2, from toggling while the reference clock pulse 402 is suppressed.

In a particular illustrative embodiment, only a single one of the reference clock pulses 402 is suppressed when the divided clock signal 404 and the external divided clock signal 406 transition between clock states out of synchronization with one another to avoid overcorrecting the divided clock signal 404. For example, if two consecutive reference clock pulses 402 were suppressed when the a divided clock signal 404 was leading the external divided clock signal 406 by only one of the reference clock pulses 402, the divided clock signal 404 would then trail the external divided clock signal by one reference clock pulse 402. Thus, an illustrative embodiment that delays toggling of the divided clock signal 404 by suppressing one reference clock pulse 402 avoids over-correcting the divided clock signal 404.

Because the reference clock pulses 402, the divided clock signal 404, and the external divided clock signal 406 may operate at speeds up to many gigahertz or even faster, the divided clock signal 404 may be rapidly synchronized to the external divided clock signal 406. For example, when the reference clock pulses 402 operate at a frequency of 8 gigahertz, in a 1:8 demultiplexer, the divided clock signal 404 and the external divided clock signal 406 may operate at 500 megahertz, i.e., the divided clock signal 404 and the external divided clock signal 406 cycle through one period for every sixteen reference clock pulses 402. When maximally out of synchronization, the divided clock signal 404 leads the external divided clock signal 406 by fifteen reference clock pulses. By suppressing one reference clock pulse 402 during each period of the divided clock signal 404 when the divided clock signal 404 and the external divided clock signal 406 transition between clock cycles out of synchronization, the reference clock pulses 402 will be suppressed during only a few periods of the 1 gigahertz external divided clock signal 406. Thus, by suppressing only one of the reference clock pulses 402 when the divided clock signal 404 and the external divided clock signal 406 transition between clock states out of synchronization, the divided clock signal 404 is synchronized to the external divided clock signal 406 within microseconds.

Figure 5:
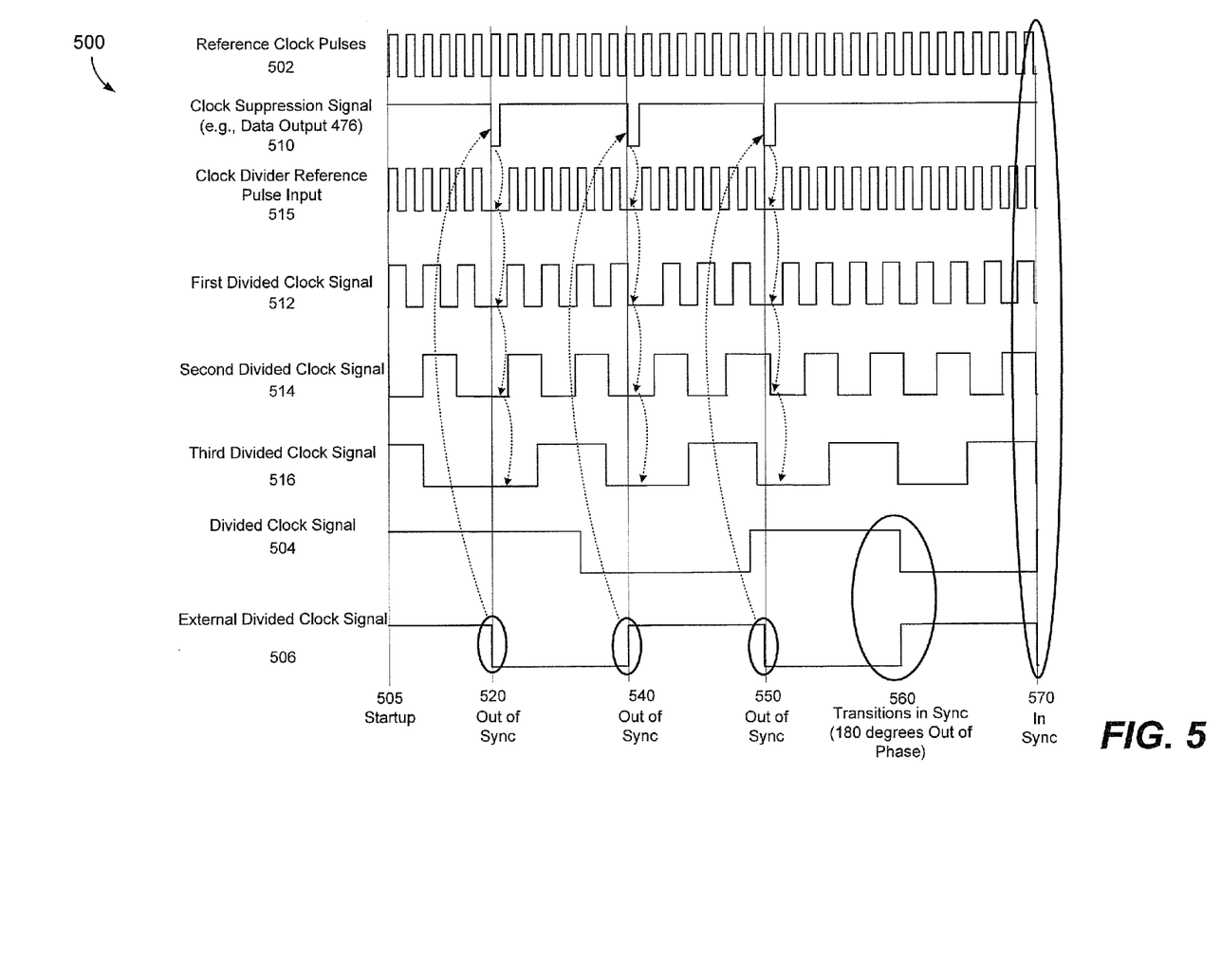
FIG. 5 is a timing diagram of a plurality of signals manipulated by a divided clock signal to an external divided clock signal.

FIG. 5 is a timing diagram 500 of a plurality of signals manipulated to synchronize a divided clock signal 504 to an external divided clock signal 506. The timing diagram 500 also shows the first divided clock signal 512, the second divided clock signal 514, and the third divided clock signal 516, which are comparable to the first divided clock signal 284, the second divided clock signal 288, and the third divided clock signal 292 of FIG. 2. The timing diagram 500 also shows a clock divider reference pulse input 515, which is comparable to the clock divider reference pulse input 495 of FIG. 4 that is used to drive the clock divider 280 (FIG. 2) of the slave device to synchronize a slave device with a master device.

The timing diagram 500 shows reference clock pulses 502, such as those generated by the clock generator 160 of FIG. 1 and received by the demultiplexer 200 of FIG. 2 and the clock transition synchronization circuit 400 of FIG. 4. A clock suppression signal 510, such as the data output 476 of the flip-flop FF3 470 of FIG. 4, controls the suppression of the reference clock pulses to a clock divider, such as the clock divider 280 of FIG. 2. For example, the clock divider 280 in FIG. 2 may generate the first divided clock signal 284, the second divided clock signal 288, the third divided clock signal 292, and the divided clock signal 230. The clock suppression signal 510 suppresses one or more of the reference clock pulses 502 from being presented to the clock divider reference pulse input 495. The clock suppression signal 510 is issued when the divided clock signal 506 and the external divided clock signal 506 are determined to have transitioned between clock states out of synchronization, such as by the edge detector 428 of FIG. 4. The divided clock signal 504 and the external divided clock signal 506, for example, may be representative of the divided clock signal 230 and the external divided clock signal 245 of FIG. 2, respectively. In another example, the divided clock signal 504 and the external divided clock signal 506 may be the divided clock signal 404 and the external divided clock signal 406 of FIG. 4, respectively.

The timing diagram 500 starts with states of the signals at startup 505 of a device, when the states of the signals may be indeterminate. According to a particular illustrative embodiment, synchronization of the divided clock signal 504 with the external divided clock signal 506 commences upon startup 505. Once the signals are synchronized, because the signals are driven by the same reference clock pulses 502, the divided clock signal 504 should remain in synchronization with the external divided clock signal 506 while the device is in operation.

The reference clock pulses 502 may be provided to a master device generating the external divided clock signal 506, such as the X:Y demultiplexer 110 of FIG. 1. The reference clock pulses 502 may also be provided to one or more slave devices, such as the X:Y demultiplexer 120 of FIG. 2 that generates divided clock signals such as the divided clock signal 504. A clock suppression signal 510 is generated when the divided clock signal 504 and the external divided clock signal 506 transition between clock states out of synchronization with one another. In the particular illustrative embodiment, the data output 476 of the flip-flop FF3 470 of FIG. 4 is the clock suppression signal 510 because, when the data output 476 of the flip-flop FF3 470 presents a low logical data signal, the AND gate A1 480 suppresses a next reference clock pulse 502. However, in other embodiments, other signals that cause one of the reference clock pulses 502 to be suppressed may be used as the clock suppression signal 510.

When it is determined that the divided clock signal 504 and the external divided clock signal 506 have transitioned between clock states out of synchronization, such as at points 520, 540, 550, a change in the clock suppression signal 510 is triggered. For example, at point 520, the external divided clock signal 506 transitions to a low logical level signal when the divided clock signal 504 continues to present a high logical level signal. Thus, the clock suppression signal 510 may transition to a low logical level signal. The change in the clock suppression signal 510 results in one of the reference clock signals 502 being suppressed. Suppression of one of the reference clock signals may delay toggling of a clock divider, such as the clock divider 280 of FIG. 2. When one reference clock pulse is suppressed, toggling of a first divider, such as the first divider 282 of FIG. 2, may be delayed. The delay may result in the first divider toggling a first divided clock signal 512. A second divider, such as the divider 286 of FIG. 2, that receives the first divided clock signal 512, also will delay toggling of a second divided clock signal 514. A third divider, such as the divider 290 of FIG. 2 that generates the third divided clock signal 516, also will delay toggling of the third divided clock signal 516. In turn, a last divider, such as the divider 294 of FIG. 2 that generates the divided clock signal 504, also will delay toggling of the divided clock signal 504.

Toggling of the divided clock signal 504 is delayed by one reference clock pulse 502 until the divided clock signal 504 and the external divided clock signal 506 transition between clock states in synchronization, such as at points 560 and 570. As previously described with reference to FIG. 3, all of the clock signals 502, 512, 514, 516, shown in FIG. 5 have a simultaneous trailing edge when the divided clock signal 504 and the external divided clock signal 506 transition between clock states in synchronization.

Figure 6:
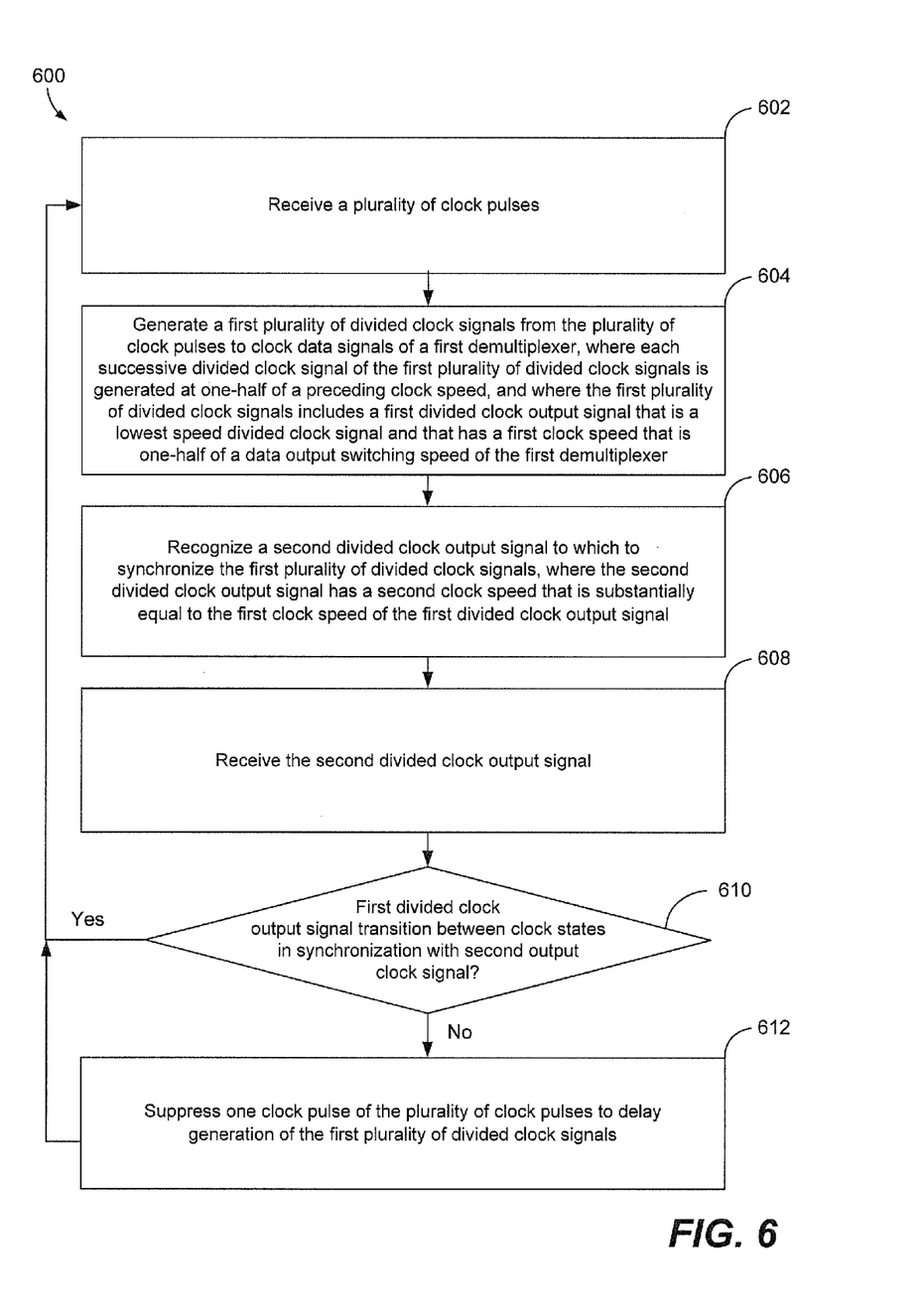
FIG. 6 is a flow diagram of a particular illustrative embodiment of a method of synchronizing divided clock signals.

FIG. 6 is a flow diagram of a particular illustrative embodiment of a method 600 of synchronizing divided clock signals. A plurality of clock pulses, such as the reference clock pulses 202 of FIG. 2 or the reference clock pulses 402 of FIG. 4, are received, at 602. A first plurality of divided clock signals are generated from the plurality of clock pulses, at 604. The first plurality of divided clock signals is used to clock data signals of a first demultiplexer, such as the demultiplexer 200 of FIG. 2. Each of the first plurality of divided clock signals is generated at one-half of a preceding clock speed. The first plurality of divided clock signals includes a first divided clock output signal that is a lowest speed divided clock signal. The first divided clock output signal has a first clock speed that is one-half of a data output switching speed of the first demultiplexer.

For example, the demultiplexer 200 of FIG. 2 includes a plurality of four divided clock signals. The first divided clock signal 284 is generated at one-half the speed of a preceding clock signal which, in the case of the first divided clock signal 284 is an originally provided clock signal, the reference clock pulses 202. The second divided clock signal 288 is generated at one-half the speed of the first divided clock signal 284, or at one-fourth the speed of the originally-supplied clock signal. A third divided clock signal 292 is generated at one-half the speed of the second divided clock signal 288, or at one-eighth the speed of the originally-supplied clock signal. A fourth divided clock signal is the divided clock signal 230, which is generated at one-half the speed of the third divided clock signal 292, or at one-sixteenth the speed of the originally-supplied clock signal. The divided clock signal 230 is the divided clock output signal provided at the divided clock output 224.

The divided clock output signal is a lowest speed divided clock signal of the plurality of divided clock signals. The divided clock output signal operates at a first clock speed that is one-half of a data output switching speed of the demultiplexer 200. The data outputs 223 are switched at a speed of the third divided clock signal 292 produced by the third divider 290. The divided clock signal 230, which is the divided clock output signal produced at the divided clock output 224, is produced by the fourth divider 294 and, thus, operates at one-half of the speed of the third divided clock signal 292. Because the third divided clock signal 292 is used to clock the switching of the data outputs 223, the divided clock output signal operates at one-half the speed at which the data outputs 223 are switched.

A second divided clock output signal to which the first plurality of divided clock signals is to be synchronized, is recognized, at 606. The second divided clock output signal has a second clock speed that is substantially equal to the first clock speed of the first divided clock output signal. The second divided clock signal is received, at 608.

At 610, it is determined whether the first divided clock output signal transitions between clock states in synchronization with the second divided clock output signal. When the first divided clock output signal transitions between clock states in synchronization with the second divided clock output signal, the method 600 returns to 602 where the plurality of clock pulses continue to be received. By contrast, when the first divided clock output signal does not transition between clock states in synchronization with the second divided clock output signal, one clock pulse of the plurality of clock pulses is suppressed to delay generation of the first plurality of divided clock signals, at 612. After suppressing one clock pulse at 612, the method 600 returns to 602 to continue receiving the plurality of clock pulses.

In a particular illustrative embodiment, the second divided clock output signal is generated by a master demultiplexer to which the first demultiplexer is configured to operate as a slave demultiplexer. As described with reference to FIGS. 3 and 5, when the first divided clock output signal and the second divided clock output signal transition between clock states in synchronization with each other, regardless of whether the first divided clock output signal and the second divided clock output signal are in phase, the other divided clock signals will transition in synchronization and in phase. Thus, as long as the first divided clock output signal is synchronized so that is transitions between clock states in synchronization with the second divided clock output signals, each of the other divided clock signals of the first plurality of divided clock signals will be in synchronization with a divided clock signal of the second plurality of divided clock signals that operates at a same speed.

Using particular illustrative embodiments as disclosed herein, a plurality of demultiplexers may be operated with synchronized divided clock signals. Thus, a high speed digital data stream can be deserialized for processing using commercially available demultiplexers. Deserialization of a large data stream may prove beneficial in receiving telemetry data from a satellite or in otherwise processing data transmitted over a high speed network. The demultiplexers may be synchronized without relying on potentially inconsistent clock reset inputs. Similarly, the demultiplexers may be synchronized without designing a circuit to accommodate a clock reset system capable of simultaneously resetting a plurality of devices. As a result, data may be deserialized in proper alignment without complex coding of output data to facilitate realignment of data that was not properly deserialized.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. For example, method steps may be performed in a different order than is shown in the figures or one or more method steps may be omitted. Accordingly, the disclosure and the figures are to be regarded as illustrative rather than restrictive.

Moreover, although specific embodiments have been illustrated and described herein, it should be appreciated that any subsequent arrangement designed to achieve the same or similar results may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, the claimed subject matter may be directed to less than all of the features of any of the disclosed embodiments.

What is claimed is:

1. A circuit comprising:
   a reference clock input to receive clock pulses at a reference clock speed;
   an internal divided clock signal input to receive a divided clock signal from a clock divider, wherein the clock divider is driven by reference clock pulses, and wherein the clock divider generates the divided clock signal at a second clock speed that is a fraction of the reference clock speed;
   an external divided clock input to receive an external divided clock signal, wherein the external divided clock signal is driven by the reference clock pulses, and wherein the external divided clock signal operates at the second clock speed; and
   a clock transition synchronization circuit, including:
      an edge detector, wherein the edge detector generates an out-of synchronization signal when only one of the divided clock signal and the external divided clock signal transitions to a different clock state; and
      a synchronous pulse suppressor, wherein the synchronous pulse suppressor suppresses application of a single reference clock pulse to the clock divider in response to the edge detector generating the out-of-synchronization signal.

2. The circuit of claim 1, wherein the divided clock signal transitions out-of-synchronization with the external divided clock signal when the divided clock signal and the external divided clock signal transition between clock states upon a different clock pulse of the reference clock pulses.

3. The circuit of claim 1, wherein the divided clock signal is used to clock a first data tree of a first demultiplexer.

4. The circuit of claim 3, wherein:
the reference clock speed is substantially equal to a first input speed of input data received at data inputs of the first demultiplexer; and
the second clock speed is substantially equal to one-half of a first output speed of output data generated at first data outputs of the first demultiplexer.

5. The circuit of claim 1, wherein the edge detector includes an exclusive or (XOR) gate, a first latch, and a Not-AND (NAND) gate, wherein outputs of the XOR gate and an inverse data output of the first latch are supplied to the NAND gate such that the NAND gate generates a clock pulse suppression signal when only one of the divided clock signal and the external divided clock signal transitions to the different clock state.

6. The circuit of claim 1, wherein the synchronous pulse suppressor includes:
a second latch to maintain the out-of-synchronization signal for a duration of the single reference clock pulse; and
a first AND logic gate to generate a clock suppression signal for the duration of the single reference clock pulse.

7. The circuit of claim 1, wherein the synchronous pulse suppressor includes:
a second latch to maintain the clock suppression signal for a duration of the single reference clock pulse; and
a second logic gate to apply the clock suppression signal to suppress one of the reference clock pulses.

8. The circuit of claim 1, wherein the clock transition synchronization circuit suppresses application of one or more of the reference clock pulses to the clock divider upon startup of the clock divider and the clock transition synchronization circuit ceases to suppress application of the one or more reference clock pulses to the clock divider when the divided clock signal transitions in synchronization with the external divided clock signal when the divided clock signal and the external divided clock signal transition to a same clock state or to an opposite clock state.

9. The circuit of claim 1, wherein the external divided clock signal is received from a second demultiplexer, wherein the divided clock signal is synchronized with the external divided clock signal to synchronize first data outputs of the first demultiplexer with second data outputs of the second demultiplexer.

10. A demultiplexer comprising:
a first number of data inputs to receive data at a first clock speed;
a second number of data outputs to output data at a second clock speed, wherein the second number is at least double the first number;
a data tree to route a data bit received at any of the data inputs to one of the data outputs;
a clock divider, wherein the clock divider is configured to receive reference clock pulses at the first clock speed and to generate a divided clock signal at the second clock speed, and wherein the clock divider is clocked by the reference clock pulses; and
a clock transition synchronization circuit, wherein the clock transition synchronization circuit is configured to receive an external divided clock signal at the second clock speed, the clock transition synchronization circuit including:
an edge detector, wherein the edge detector generates an out-of-synchronization signal when only one of the divided clock signal and the external divided clock signal transitions to a different clock state in response to receiving one of the reference clock pulses; and
a synchronous pulse suppressor, wherein the synchronous pulse suppressor suppresses application of a single reference clock pulse to the clock divider in response to the edge detector generating the out-of-synchronization signal until the divided clock signal transitions between clock states in synchronization with the external divided clock signal.

11. The demultiplexer of claim 10, wherein the demultiplexer is a slave demultiplexer and wherein the external divided clock signal is received from a master demultiplexer.

12. The demultiplexer of claim 11, wherein the external divided clock signal is received from the master demultiplexer, wherein the divided clock signal is synchronized with the external divided clock signal to synchronize first data outputs of the slave demultiplexer with second data outputs of the master demultiplexer.

13. The demultiplexer of claim 12, wherein the master demultiplexer and the slave demultiplexer operate as a single demultiplexer, the single demultiplexer having twice a number of data inputs as the slave demultiplexer and twice a number of the first data outputs as the slave demultiplexer.

14. The demultiplexer of claim 10, wherein one of:
the first number of data inputs is one and the second number of data outputs is eight; and
the first number of data inputs is two and the second number of data outputs is sixteen.

15. The demultiplexer of claim 10, wherein the divided clock signal is presented at a divided clock signal output of the demultiplexer to present a second external divided clock signal.

16. A method comprising:
receiving a plurality of reference clock pulses;
generating a first plurality of divided clock signals from the plurality of reference clock pulses to clock data signals of a first demultiplexer, wherein each of the first plurality of divided clock signals is generated at one-half of a preceding clock speed, and wherein the first plurality of divided clock signals includes a first divided clock output signal that is a lowest speed divided clock signal of the first plurality of divided clock signals and that has a first clock speed and that is one-half of a data output switching speed of the first demultiplexer;
receiving a second divided clock output signal of a second demultiplexer to which to synchronize the first plurality of divided clock signals, wherein the second divided clock signal has a second clock speed that is substantially equal to the first clock speed of the first divided clock output signal;
generating an out-of-synchronization signal when the first divided clock output signal transitions to a different state than the second divided clock output signal in response to receiving a clock pulse of the plurality of reference clock pulses; and
in response to receiving the out-of-synchronization signal, suppressing provision of a clock pulse of the plurality of reference clock pulses to delay generation of the first plurality of divided clock signals.

17. The method of claim 16, wherein the second divided clock output signal is a lowest speed divided clock signal of a second plurality of divided clock signals generated by the second demultiplexer and the first demultiplexer operates as a slave demultiplexer of the second demultiplexer.

18. The method of claim 17, further comprising, when the first divided clock output signal transitions between clock states in synchronization with the second divided clock output signal, and each other first divided clock signal of the first plurality of divided clock signals transitions in synchronization and in phase with each other second divided clock signal of the second plurality of divided clock signals operating at a same speed, using the first plurality of divided clock signals to clock a first data tree and first data outputs of the first demultiplexer and using the plurality of second divided clock signals to clock second data outputs and a second data tree of the second demultiplexer.

19. The method of claim 18, wherein the first demultiplexer and the second demultiplexer are arranged in parallel to generate synchronized output signals.

20. The method of claim 19, wherein data inputs of the first demultiplexer and the second demultiplexer are received from an analog-to-digital converter and are deserialized by the first demultiplexer and the second demultiplexer.

* * * * *